US012663472B2

(12) United States Patent　(10) Patent No.: US 12,663,472 B2
Lee　(45) Date of Patent: Jun. 23, 2026

(54) BATTERY DIAGNOSING APPARATUS, BATTERY SYSTEM AND BATTERY DIAGNOSING METHOD

(71) Applicant: LG ENERGY SOLUTION, LTD., Seoul (KR)

(72) Inventor: Hyun-Jun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 396 days.

(21) Appl. No.: 18/032,022

(22) PCT Filed: Jan. 6, 2022

(86) PCT No.: PCT/KR2022/000255
§ 371 (c)(1),
(2) Date: Apr. 14, 2023

(87) PCT Pub. No.: WO2022/149890
PCT Pub. Date: Jul. 14, 2022

(65) Prior Publication Data
US 2023/0366938 A1　Nov. 16, 2023

(30) Foreign Application Priority Data
Jan. 8, 2021　(KR) ........................ 10-2021-0002849

(51) Int. Cl.
*G01R 31/367*　(2019.01)
*G01R 31/36*　(2020.01)
(Continued)

(52) U.S. Cl.
CPC ....... *G01R 31/367* (2019.01); *G01R 31/3648* (2013.01); *G01R 31/385* (2019.01); *G01R 31/392* (2019.01)

(58) Field of Classification Search
CPC .. G01R 31/367; G01R 31/385; G01R 31/392; B60L 3/0046
See application file for complete search history.

(56) References Cited

U.S. PATENT DOCUMENTS 9,130,379 B2　9/2015　Sakabe et al.
10,493,848 B2 *　12/2019　Ono ...................... B60L 3/0046
(Continued)

FOREIGN PATENT DOCUMENTS

CN　107923949 A　4/2018
CN　110188803 A　8/2019
(Continued)

OTHER PUBLICATIONS

Office Action issued in corresponding Japanese Patent Application No. 2023-515219, dated Mar. 26, 2024.
(Continued)

*Primary Examiner* — Lam S Nguyen
(74) *Attorney, Agent, or Firm* — Morgan, Lewis & Bockius LLP

(57) ABSTRACT

A battery diagnosing apparatus may include a voltage measuring circuit for generating a voltage signal representing a battery voltage across both ends of each of batteries; a database for storing abnormal patterns, a plurality of reference time series, and a predetermined corresponding relationship between the abnormal patterns and the plurality of reference time series; and a control unit for generating a plurality of input time series representing a change history of the battery voltage of each battery, based on the voltage signal. The control unit may extract an abnormal input time series representing an abnormal voltage behavior among the plurality of input time series by comparing the plurality of input time series with each other. The control unit may identify an abnormal pattern of the abnormal input time series among the abnormal patterns by comparing the abnor- (Continued)

mal input time series with the plurality of reference time series one by one.

13 Claims, 5 Drawing Sheets

(51) Int. Cl.
   *G01R 31/385*      (2019.01)
   *G01R 31/392*      (2019.01)

(56)                References Cited

U.S. PATENT DOCUMENTS

| | | | |
|---|---|---|---|
| 2009/0087722 A1 | 4/2009 | Sakabe et al. |
| 2013/0234672 A1 | 9/2013 | Kubota et al. |
| 2014/0089692 A1 | 3/2014 | Hanafusa |
| 2015/0048797 A1 | 2/2015 | Song |
| 2015/0115969 A1 | 4/2015 | Ishida et al. |
| 2017/0003352 A1 | 1/2017 | Barre et al. |
| 2017/0242076 A1 | 8/2017 | Yoshiura |
| 2019/0077265 A1 | 3/2019 | Ono et al. |
| 2020/0125970 A1 | 4/2020 | Toyama |
| 2020/0191876 A1 | 6/2020 | Shin et al. |
| 2020/0202643 A1 | 6/2020 | He |
| 2020/0269722 A1 | 8/2020 | Aykol et al. |
| 2021/0141024 A1 | 5/2021 | Faivre et al. |
| 2022/0155375 A1 | 5/2022 | Takegami et al. |
| 2023/0014068 A1 | 1/2023 | Ayoub et al. |

FOREIGN PATENT DOCUMENTS

| | | | |
|---|---|---|---|
| CN | 111373586 A | | 7/2020 |
| CN | 111426955 A | | 7/2020 |
| CN | 111612204 A | | 9/2020 |
| JP | 2004-304939 A | | 10/2004 |
| JP | 2007134146 A | * | 5/2007 |
| JP | 2015-103283 A | | 6/2015 |
| JP | 5842054 B2 | | 1/2016 |
| JP | 2017-509103 A | | 3/2017 |
| JP | 2020-520461 A | | 7/2020 |
| JP | 6751915 B2 | | 9/2020 |
| KR | 10-1465380 B1 | | 11/2014 |
| KR | 2017-151598 A | | 8/2017 |
| KR | 10-2017-0109435 A | | 9/2017 |
| KR | 10-2018-0100016 A | | 9/2018 |
| KR | 10-2019-0098254 A | | 8/2019 |
| WO | 2013/140781 A1 | | 9/2013 |
| WO | 2017/130258 A1 | | 8/2017 |
| WO | 2018/220115 A1 | | 6/2018 |
| WO | 2020/208762 A1 | | 10/2020 |

OTHER PUBLICATIONS

The extended European Search Report, dated Mar. 5, 2024, issued in corresponding EP Patent Application No. 22736867.7. (Note: US 2017/0003352 A1 has been previously cited.).

Xue, et al., "Fault diagnosis and abnormality detection of lithium-ion battery packs based on statistical distribution", Journal of Power Sources, 2021, vol. 482, 228964, 12 pages.

International Search Report (with translation) and Written Opinion dated Apr. 21, 2022, for corresponding International Patent Application No. PCT/KR2022/000255.

Office Action issued in corresponding Chinese Patent Application No. 202280006790.7 dated Aug. 2, 2025. (Note: CN 111426955 A and WO 2018/220115 A1 were previously cited.).

* cited by examiner

BATTERY DIAGNOSING APPARATUS, BATTERY SYSTEM AND BATTERY DIAGNOSING METHOD

TECHNICAL FIELD

The present application claims priority to Korean Patent Application No. 10-2021-0002849 filed on Jan. 8, 2021 in the Republic of Korea, the disclosures of which are incorporated herein by reference.

The present disclosure relates to a technology for diagnosing an abnormality in a battery, and more particularly, to a battery diagnosing apparatus, a battery system, and a battery diagnosing method capable of identifying an abnormal pattern that causes abnormal voltage behavior of the battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

As applications requiring high voltage become widespread, a battery system employing a structure in which a plurality of batteries are connected in series is widely used. As the number of batteries included in the battery system increases, the frequency of battery abnormalities inevitably increases. Accordingly, the need for a diagnostic technology to accurately detect a battery abnormality is increasing.

Recently, the method of detecting abnormality of a battery based on battery information including a plurality of parameters related to the battery (e.g., voltage, current, temperature, etc. of the battery) and the usage state of the battery (e.g., charging, discharging, resting) is widely used.

However, the above detection method has a disadvantage in that a large amount of computation and a long time are required to detect abnormalities of each battery because the process for a battery diagnosing apparatus to monitor battery information using various sensors is essential.

Meanwhile, there is an attempt to detect abnormal voltage behavior of each battery by comparing a plurality of battery voltages obtained from a plurality of batteries at a specific time point or a predetermined time unit with each other while excluding the parameters other than voltage. However, the voltage-based abnormal detection may only detect whether each battery exhibits abnormal voltage behavior, and does not provide information on why the abnormal voltage behavior appears.

DISCLOSURE

Technical Problem

The present disclosure is designed to solve the problems of the related art, and therefore the present disclosure is directed to providing a battery diagnosing apparatus, a battery system and a battery diagnosing method, which may identify an abnormal pattern causing abnormal voltage behavior of each battery by comparing input time series of each battery extracted as indicating abnormal voltage behavior through voltage-based abnormality detection with a plurality of reference time series that are one-to-one associated with a plurality of different abnormal patterns, without monitoring parameter(s) other than the battery voltage.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure comprises: a voltage measuring circuit configured to generate a voltage signal representing a battery voltage that is a voltage across both ends of each of a plurality of batteries; a database in which a plurality of abnormal patterns, a plurality of reference time series, and a predetermined corresponding relationship between the plurality of abnormal patterns and the plurality of reference time series are recorded; and a control unit configured to generate a plurality of input time series representing a change history of the battery voltage of each of the plurality of batteries, based on the voltage signal. The control unit is configured to extract an abnormal input time series representing an abnormal voltage behavior among the plurality of input time series by comparing the plurality of input time series with each other. The control unit is configured to identify an abnormal pattern of the abnormal input time series among the plurality of abnormal patterns by comparing the abnormal input time series with the plurality of reference time series one by one.

For each of the plurality of reference time series, the control unit may be configured to: calculate a first similarity value representing a signal distance between the abnormal input time series and each reference time series by using dynamic time warping, convert the abnormal input time series and each reference time series into a first arranged time series and a second arranged time series having the same time length, respectively, by using the dynamic time warping, calculate a second similarity value representing a Pearson correlation coefficient between the first arranged time series and the second arranged time series, and determine a matching index between the abnormal input time series and each reference time series to be identical to a value obtained by dividing the first similarity value by the second similarity value. The control unit may be configured to identify an abnormal pattern of the abnormal input time series to be identical to an abnormal pattern corresponding to a reference time series associated with one of the plurality of matching indexes determined for the plurality of reference time series.

The control unit may be configured to identify an abnormal pattern of the abnormal input time series to be identical to an abnormal pattern corresponding to a reference time series associated with a minimum matching index among the plurality of matching indexes.

For each of the plurality of reference time series, the control unit may be configured to: convert the abnormal input time series and each reference time series into a first normalized time series and a second normalized time series, respectively, by using maximum-minimum normalization, calculate a first similarity value representing a signal distance between the first normalized time series and the second normalized time series by using dynamic time warping, convert the first normalized time series and the second normalized time series into a first arranged time series and a second arranged time series having the same time length, respectively, by using the dynamic time warping, calculate a second similarity value representing a Pearson correlation coefficient between the first arranged time series and the second arranged time series, and determine a matching index between the abnormal input time series and each reference time series to be identical to a value obtained by dividing the first similarity value by the second similarity value. The control unit may be configured to identify an abnormal pattern of the abnormal input time series to be identical to an abnormal pattern corresponding to a reference time series associated with one of the plurality of matching indexes determined for the plurality of reference time series.

The control unit may be configured to identify an abnormal pattern of the abnormal input time series to be identical to an abnormal pattern corresponding to a reference time series associated with a minimum matching index among the plurality of matching indexes.

For each of the plurality of reference time series, the control unit may be configured to: calculate a first similarity value representing a signal distance between the abnormal input time series and each reference time series by using dynamic time warping, convert the abnormal input time series and each reference time series into a first arranged time series and a second arranged time series having the same time length, respectively, by using the dynamic time warping, calculate a second similarity value representing a Pearson correlation coefficient between the first arranged time series and the second arranged time series, convert the first arranged time series and the second arranged time series into a first normalized time series and a second normalized time series, respectively, by using maximum-minimum normalization, calculate a third similarity value representing a signal distance between the first normalized time series and the second normalized time series by using dynamic time warping, calculate a fourth similarity value representing a Pearson correlation coefficient between the first normalized time series and the second normalized time series, and determine a matching index between the abnormal input time series and each reference time series by dividing any one of the first similarity value and the third similarity value or the product thereof by any one of the second similarity value and the fourth similarity value or the product thereof. The control unit may be configured to identify an abnormal pattern of the abnormal input time series to be identical to an abnormal pattern corresponding to a reference time series associated with one of the plurality of matching indexes determined for the plurality of reference time series.

The control unit may be configured to identify an abnormal pattern of the abnormal input time series to be identical to an abnormal pattern corresponding to a reference time series associated with a minimum matching index among the plurality of matching indexes.

The control unit may be configured to add the abnormal input time series to the database as a new reference time series corresponding to the identified abnormal pattern.

A battery system according to another aspect of the present disclosure comprises the battery diagnosing apparatus.

A battery diagnosing method according to still another aspect of the present disclosure comprise: collecting a voltage signal representing a battery voltage that is a voltage across both ends of each of a plurality of batteries; generating a plurality of input time series representing a change history of the battery voltage of each of the plurality of batteries, based on the voltage signal; extracting an abnormal input time series representing an abnormal voltage behavior among the plurality of input time series by comparing the plurality of input time series with each other; and identifying an abnormal pattern of the abnormal input time series among the plurality of abnormal patterns having a predetermined corresponding relationship with the plurality of reference time series by comparing the abnormal input time series with the plurality of reference time series one by one.

Advantageous Effects

According to at least one of the embodiments of the present disclosure, it is possible to identify an abnormal pattern causing an abnormal voltage behavior of each battery by comparing the input time series of each battery extracted as indicating abnormal voltage behavior through voltage-based abnormality detection with the plurality of reference time series one-to-one associated to a plurality of different abnormal patterns, without monitoring parameter(s) other than the battery voltage.

In addition, according to at least one of the embodiments of the present disclosure, for a pair of an input time series and each reference time series, it is possible to determine a matching index between the input time series and each reference time series by combining two similar values determined through dynamic time warping and Pearson correlation coefficient. Then, it is possible to identify an abnormal pattern of the battery exhibiting abnormal voltage behavior from the one-to-one corresponding relationship between the plurality of reference time series, the plurality of matching indexes and the plurality of abnormal patterns.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate an embodiment of the present disclosure and together with the foregoing disclosure, serve to provide further understanding of the technical features of the present disclosure, and thus, the present disclosure is not construed as being limited to the drawing.

FIG. 2 is a diagram exemplarily showing the results of a battery voltage of a normal battery and a battery voltage of an abnormal battery obtained over a time region having the same use condition.

FIGS. 3 and 4 are exemplary graphs referenced for explaining a comparison procedure between an abnormal input time series and a plurality of reference time series.

DETAILED DESCRIPTION

Hereinafter, an embodiment of the present disclosure will be described in detail with reference to the accompanied drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. In addition, a term such as <control unit> used in the specification means a unit that processes at least one function or operation, and may be implemented as hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
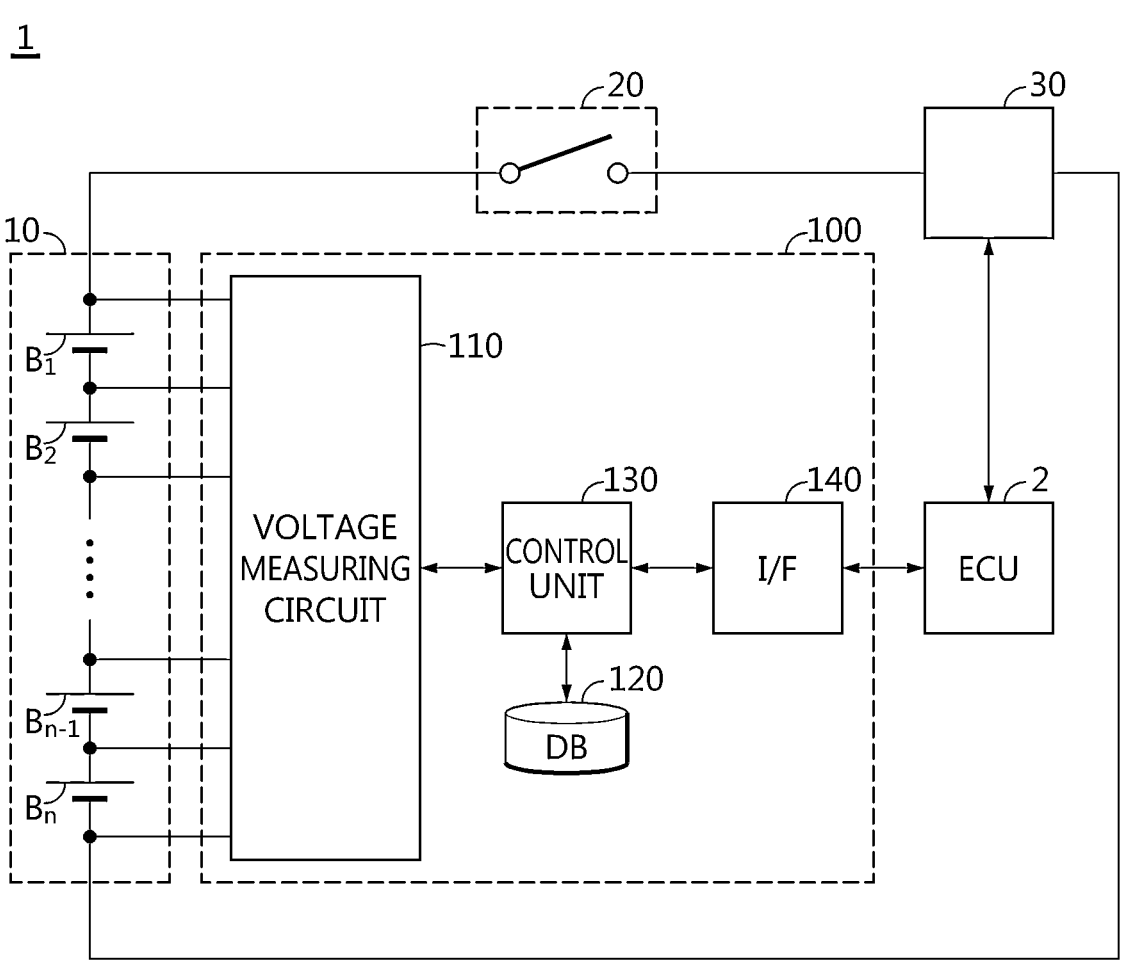
FIG. 1 is a diagram exemplarily showing the configuration of a battery system according to the present disclosure.

FIG. 1 is a diagram exemplarily showing the configuration of a battery system according to the present disclosure.

Referring to FIG. 1, the battery system 1 may be a power device including an electric load driven using a discharging power of a battery, such as an electric vehicle. Alternatively, the battery system 1 may be a charging and discharging test device used to manufacture a battery and provided to test the performance of a battery in the manufacturing processes.

The battery system 1 includes a battery assembly 10, a switch 20, a charging and discharging circuit 30, an upper controller 2 and a battery diagnosing apparatus 100. The upper controller 2 is in charge of the overall charging and discharging procedure of the battery assembly 10. That is, the upper controller 2 controls the charging and discharging circuit 30 directly or indirectly through the battery diagnosing apparatus 100 according to a predetermined charging and discharging schedule.

The battery assembly 10 includes a plurality of batteries $B_1$ to $B_n$ (n is a natural number equal to or greater than 2).

The plurality of batteries $B_1$ to $B_n$ may be electrically connected to each other in series as a single group. Alternatively, the plurality of batteries $B_1$ to $B_n$ may be grouped into two or more to enable charging and discharging independently of each other. Hereinafter, in describing the common contents of the plurality of batteries $B_1$ to $B_n$, the reference symbol 'B' will be used to refer to the battery. The type of the battery B is not particularly limited as long as it can be repeatedly charged and discharged, such as a lithium-ion battery.

The switch 20 is installed on a power line PL that connects power input/output terminals of the battery assembly 10 and power input/output terminals of the charging and discharging circuit 30. While the switch 20 is turned on, power may be transferred from one of the battery assembly 10 and the charging and discharging circuit 30 to the other. The switch 20 may be implemented by using any one of known switching devices such as a relay, a FET (Field Effect Transistor), and the like, or by combining two or more thereof. The control unit 130 may turn on/off the switch 20 according to the state of the battery assembly 10.

The charging and discharging circuit 30 is operatively coupled to the battery diagnosing apparatus 100 via the upper controller 2. When two components are operatively coupled, it means that the two components are connected to transmit and receive signals in one direction or in both directions. The charging and discharging circuit 30 may generate a DC power for charging each group of the battery assembly 10 from an AC power supplied by an external power source. The charging and discharging circuit 30 may convert a DC power from each group of the battery assembly 10 into an AC power and/or a DC power having a different voltage level, and transmit the converted power to an electrical load (not shown).

The battery diagnosing apparatus 100 includes a voltage measuring circuit 110, a database 120, and a control unit 130 that are operatively coupled to each other. The battery diagnosing apparatus 100 may further include an interface unit 140.

The voltage measuring circuit 110 is provided to be electrically connectable to a positive electrode terminal and a negative electrode terminal of each battery B. The voltage measuring circuit 110 is configured to measure a battery voltage that is a voltage across both ends of each battery B, and generate a voltage signal representing the measured battery voltage.

The database 120 records a plurality of abnormal patterns, a plurality of reference time series and a predetermined corresponding relationship between the plurality of abnormal patterns and the plurality of reference time series. The plurality of reference time series are associated one-to-one or many-to-one with a plurality of different abnormal patterns.

The plurality of abnormal patterns cause abnormal voltage behavior of the battery B and may depend on the internal structure, manufacturing method, electrode material, etc. of the battery B. For example, metal lithium deposition on the surface of the negative electrode, partial tearing of the positive electrode tab, disconnection of the positive electrode tab and/or the negative electrode tab, bending of the negative electrode tab, short circuit between the positive electrode plate and the negative electrode plate through separator, or the like may be set to abnormal patterns, respectively.

Each reference time series is a data set of temporal changes in battery voltage obtained in advance from a battery having a corresponding abnormal pattern.

In the database 120, a program and various data necessary for executing a battery diagnosing method according to embodiments to be described later may be stored in advance. The database 120 may include at least one type of storage medium, for example, among a flash memory type, a hard disk type, an SSD (Solid State Disk) type, an SDD (Silicon Disk Drive) type, a multimedia card micro type, a RAM (Random Access Memory), a SRAM (Static Random access Memory), a ROM (Read-Only Memory), an EEPROM (Electrically Erasable Programmable Read-Only Memory), and a PROM (Programmable Read-Only Memory).

The control unit 130, in hardware, may be implemented using at least one of ASICs (Application Specific Integrated Circuits), DSPs (Digital Signal Processors), DSPDs (Digital Signal Processing Devices), PLDs (Programmable Logic Devices), FPGAs (Field Programmable Gate Arrays), microprocessors, and electrical units for performing other functions.

The control unit 130 may be additionally operatively coupled to the switch 20 and/or the interface unit 140.

The interface unit 140 may be communicatively coupled to the upper controller 2 of the battery system 1. The interface unit 140 may transmit a message from the upper controller 2 to the control unit 130 and may transmit a message from the control unit 130 to the upper controller 2. The message from the control unit 130 may include information for notifying an abnormality of each battery B. For communication between the interface unit 140 and the upper controller 2, for example, a wired network such as a LAN (Local Area Network), a CAN (Controller Area Network), a daisy chain, and/or a near-distance wireless network such as Bluetooth, Zigbee, Wi-Fi, etc. may be utilized. The interface unit 140 may include an output device (e.g., a display, a speaker) that provides information received from the control unit 130 and/or the upper controller 2 in a user-recognizable form. The upper controller 2 may control the charging and discharging circuit 30 based on the battery information (e.g., abnormal voltage behavior) collected through communication with the battery diagnosing apparatus 100.

The control unit 130 may execute a diagnostic mode for detecting abnormalities of the plurality of batteries $B_1$ to $B_n$ at all times during operation or according to a request from the upper controller 2.

Now, with reference to FIGS. 2 to 5, the operation of the control unit 130 during the execution of the diagnostic mode will be described.

Figure 2:
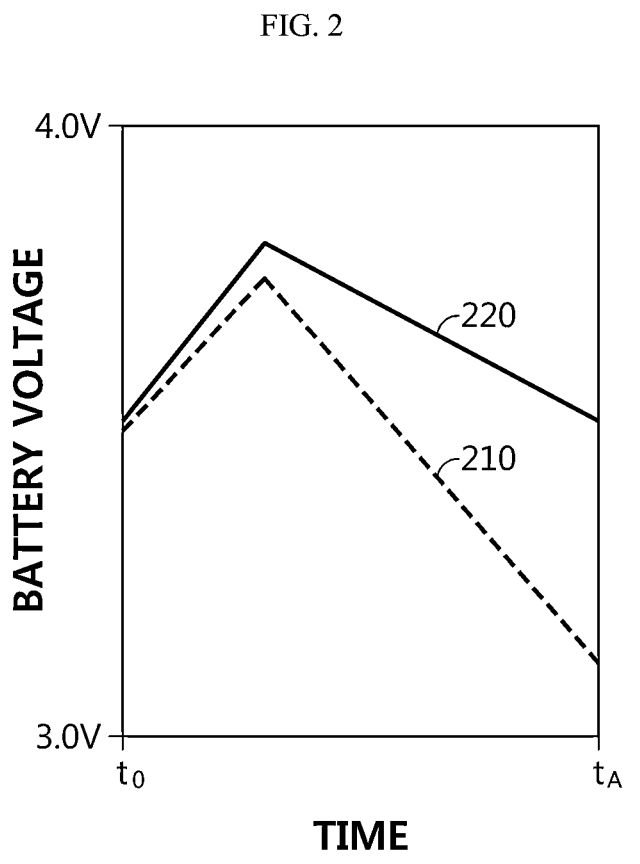

FIG. 2 is a diagram exemplarily showing the results of a battery voltage of a normal battery and a battery voltage of an abnormal battery obtained over a time region having the same use condition.

The control unit 130 collects the voltage signal from the voltage measuring circuit 110 at every unit time. The unit time is predetermined, and may be, for example, an integer multiple of a time interval at which a voltage signal is generated by the voltage measuring circuit 110.

The control unit 130 generates a plurality of input time series associated with the plurality of batteries $B_1$ to $B_n$ based on the voltage signal collected from the voltage measuring circuit 110. The generation of the plurality of input time series may be repeated at every predetermined unit time.

The control unit 130 may generate a plurality of input time series based on the voltage signals collected over a time region in which the plurality of batteries $B_1$ to $B_n$ are charged, discharged, or idle under the same use condition (e.g., a charging current, a charging voltage, a discharging current, a discharging voltage, a temperature, etc.).

When the plurality of batteries $B_1$ to $B_n$ are serially connected to each other to form a single group, all of the plurality of batteries $B_1$ to $B_n$ may be treated as having the same use condition.

When the plurality of batteries $B_1$ to $B_n$ are divided into a plurality of groups, a plurality of time regions in which a plurality of groups have the same use conditions may be identified based on the history of the use condition of each of the plurality of groups, and a plurality of input time series may be generated based on the voltage signal collected over each identified time region. As an example, when the charging and discharging circuit 30 has conducted a charging and discharging event for the first group with a specific use condition over the first time region from 10:00 to 10:03 of a specific day and the charging and discharging circuit 30 has conducted a charging and discharging event for the second group with the same use condition over the second time region from 10:00 to 10:03 of the same specific day, the control unit 130 may generate an input time series associated with the first time region for each battery B of the first group and generate an input time series associated with the second time region for each battery B of the second group. The control unit 130 may collect the input time series obtained from each battery B of the first group over the first time region and the input time series obtained from each battery B of the second group over the second time region as the same control group.

A moving window may be used to generate the input time series. The moving window has a predetermined time size, and a starting point may be a time point preceding a specific time point by the predetermined time size, and an ending point may be the specific time point. The signal length of the input time series corresponds to the time size of the moving window. For example, when the unit time is 0.1 seconds and the moving window is 10 seconds, the signal length of the input time series may be 10 seconds/0.1 seconds=100. That is, the input time series may be a vector in which 100 voltage values representing the change in sequentially measured battery voltages are arranged on the time axis. At every unit time, each of the starting and ending points of the moving window may be increased by the unit time. Each input time series is a data set representing the temporal change of the battery voltage of the battery B associated therewith.

In FIG. 2, the horizontal axis is time, the vertical axis is battery voltage, and $t_0$ and $t_4$ are the starting and ending points of the time region extracted as having the same use condition, respectively. The curve 220 corresponds to the input time series of the normal battery, and the curve 210 corresponds to the input time series of the abnormal battery. In general, among the plurality of batteries $B_1$ to $B_n$, the number of normal batteries B will be much greater than the number of abnormal batteries B. Taking this into consideration, the control unit 130 extracts an abnormal input time series 210 from the plurality of input time series by comparing the plurality of input time series with each other. The abnormal input time series 210 refers to each input time series exhibiting an abnormal voltage behavior that exceeds a certain level from the overall voltage behavior (e.g., average) of the plurality of input time series. The abnormal voltage behavior may be judged using at least one of various methods, such as whether the input time series of each battery has a voltage drop (or voltage rise) that exceeds a predetermined value at a specific time point or for a predetermined time, whether the input time series of each battery has a difference exceeding a predetermined value from an average (or median value) of the plurality of input time series, and the like, and a detailed description thereof will be omitted.

Figure 3:
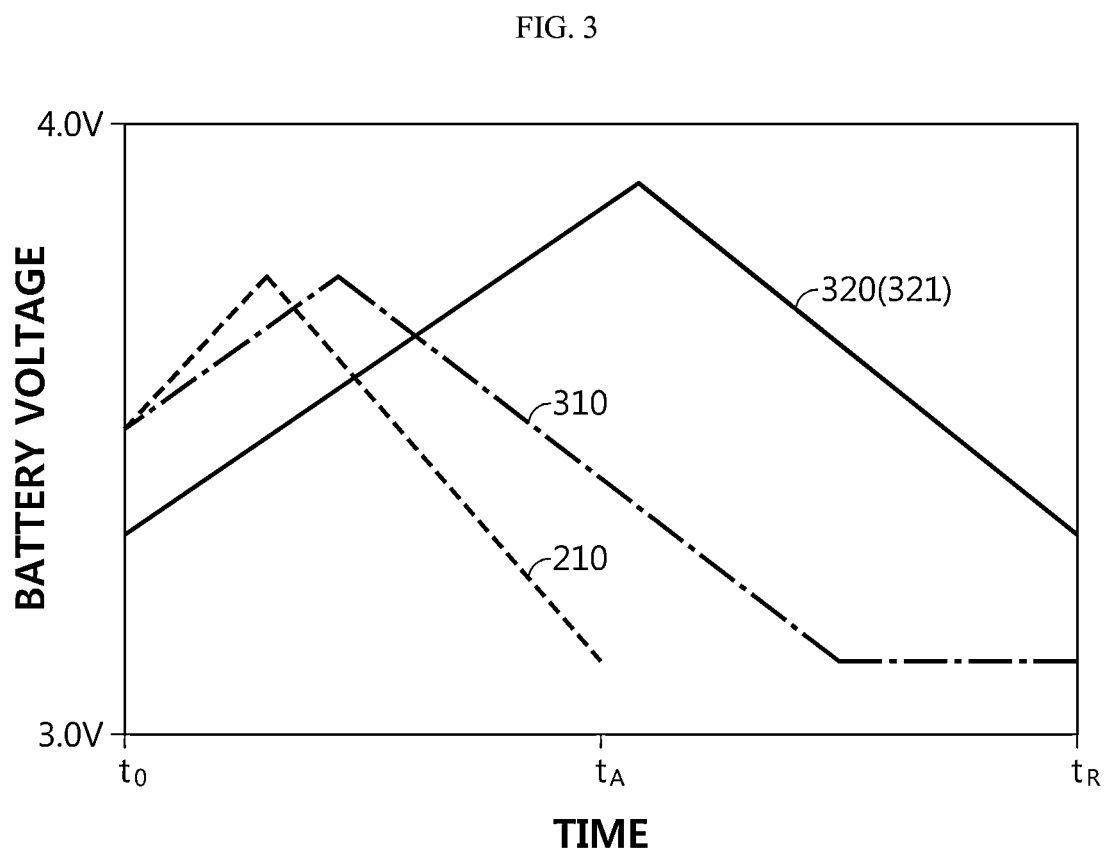
Figure 4:
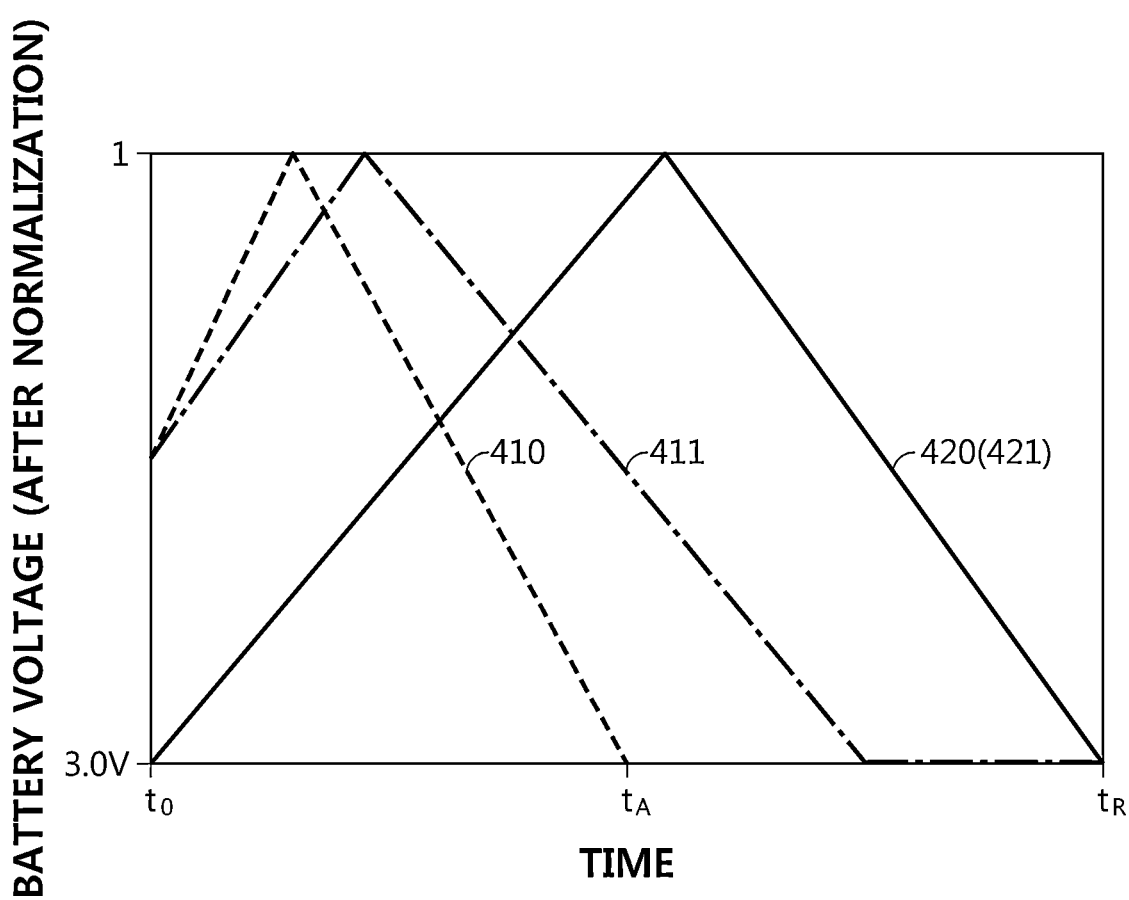

FIGS. 3 and 4 are exemplary graphs referenced for explaining a comparison procedure between an abnormal input time series and a plurality of reference time series. In FIG. 3, the horizontal axis represents time, and the vertical axis represents battery voltage.

The control unit 130 may identify an abnormal pattern of the abnormal input time series among a plurality of abnormal patterns given in advance by comparing the abnormal input time series 210 with the plurality of reference time series one by one. For example, the control unit 130 may compare the plurality of reference time series with the abnormal input time series 210 one by one in order according to an order given in advance for the plurality of reference time series. As another example, the control unit 130 may compare two or more of the plurality of reference time series with the abnormal input time series 210 at the same time, and compare the remaining reference time series with the abnormal input time series 210 in the same way. Identification of the abnormal pattern means to judge which fault state the battery B associated with the abnormal input time series has.

In FIG. 3, the curve 210 is the same as the curve 210 of FIG. 2, and the curve 320 corresponds to any one reference time series among the plurality of reference time series. In FIG. 3, $t_R$ is an ending point of the reference time series 320 when the starting points of the abnormal input time series 210 and the reference time series 320 coincide with each other. That is, FIG. 3 illustrates that the abnormal input time series 210 is shorter than the reference time series 320.

The control unit 130 may calculate a similarity value $D_{A1}$ representing a signal distance between the abnormal input time series 210 and the reference time series 320 by using dynamic time warping. As the abnormal input time series 210 is similar to the reference time series 320, the similarity value $D_{A1}$ approaches 1, and if the abnormal input time series 210 is completely identical to the reference time series 320, the similarity value $D_{A1}$ is 0. The control unit 130 may convert the abnormal input time series 210 and the reference time series 320 into an arranged time series 310 and an arranged time series 321 having the same signal length, respectively, by using dynamic time warping. That is, by dynamic time warping, the time axis of the shorter one 210 may be extended so that the shorter one of the abnormal input time series 210 and the reference time series 320 matches the signal length of the longer one 320. As described above, FIG. 3 illustrates that the reference time series 320 is longer than the abnormal input time series 210, and the arranged time series 321 is illustrated as being the same as the reference time series 320. Since the signal distance between two signals by dynamic time warping and the alignment of the time axis of the two signals are well known, a detailed description thereof will be omitted.

The control unit 130 may calculate a similarity value $D_{B1}$ representing a Pearson correlation coefficient between the arranged time series 310 and the arranged time series 321. As the arranged time series 310 is similar to the arranged time series 321, the similarity value $D_{B1}$ approaches 1, and if the arranged time series 310 is completely identical to the arranged time series 321, the similarity value $D_{B1}$ is 1.

Referring to FIG. 4, the curve 410 exemplifies a normalized time series that is the result of maximum-minimum normalization for the curve 210 of FIG. 3, and the curve 420 exemplifies a normalized time series that is the result of maximum-minimum normalization of the curves 320, 321 of FIG. 3. In FIG. 4, the horizontal axis is time, and the vertical axis represents a normalized battery voltage ranging from 0 to 1. The control unit 130 may convert the abnormal input time series 210 and the reference time series 320 into a normalized time series 410 and a normalized time series 420, respectively, by using maximum-minimum normalization.

The control unit 130 may calculate a similarity value $D_{A2}$ representing a signal distance between the normalized time series 410 and the normalized time series 420 by using dynamic time warping. The control unit 130 may convert the normalized time series 410 and the normalized time series 420 into an arranged time series 411 and an arranged time series 421 having the same time length, respectively, by using dynamic time warping. That is, by dynamic time warping, the shorter time axis 410 of the normalized time series 410 and the normalized time series 420 may be extended so that the shorter one 410 matches the signal length of the longer one 420. As described above, FIG. 3 illustrates that the reference time series 320 is longer than the abnormal input time series 210, and the arranged time series 421 is illustrated in FIG. 4 as being identical to the normalized time series 420. Alternatively, the control unit 130 may obtain the arranged time series 411 by normalizing the curve 310 of FIG. 3 by using maximum-minimum normalization.

The control unit 130 may calculate a similarity value $D_{B2}$ representing a Pearson correlation coefficient between the arranged time series 411 and the arranged time series 421. As the arranged time series 411 is similar to the arranged time series 421, the similarity value $D_{B2}$ approaches 1, and if the arranged time series 411 is completely identical to the arranged time series 421, the similarity value $D_{B2}$ is 1.

So far, it has been explained that the control unit 130 may calculate two similarity values $D_{A1}$, $D_{A2}$ representing the signal distance and two similarity values $D_{B1}$, $D_{B2}$ representing the Pearson correlation coefficient as a result of comparison between the abnormal input time series 210 and the reference time series 220. Of course, the control unit 130 may calculate both of the two similarity values $D_{A1}$, $D_{A2}$ representing the signal distance, or calculate only one of the two similarity values $D_{A1}$, $D_{A2}$ and omit the calculation of the other. Similarly, the control unit 130 may calculate both of the two similarity values $D_{B1}$, $D_{B2}$ representing the Pearson correlation coefficient, or calculate only one of the two similarity values $D_{B1}$, $D_{B2}$ and omit the calculation of the other.

The control unit 130 may determine a matching index between the abnormal input time series 210 and the reference time series 320 based on at least one of the two similarity values $D_{A1}$, $D_{A2}$ and at least one of the two similarity values $D_{B1}$, $D_{B2}$. The matching index may be obtained from a function given in advance so that its value is reduced as the abnormal input time series 210 is similar the reference time series 320. For example, the control unit 130 may determine the matching index to be identical to a value obtained by dividing the similarity value $D_{A1}$ by the similarity value $D_{B1}$.

As another example, the control unit 130 may determine the matching index to be identical to a value obtained by dividing the similarity value $D_{A1}$ by the similarity value $D_{B2}$.

As still another example, the control unit 130 may determine the matching index to be identical to a value obtained by dividing the similarity value $D_{A2}$ by the similarity value $D_{B1}$.

As still another example, the control unit 130 may determine the matching index to be identical to a value obtained by dividing the similarity value $D_{A2}$ by the similarity value $D_{B2}$.

As still another example, the control unit 130 may determine the matching index to be identical to a value obtained by dividing the product of the similarity value $D_{A1}$ and the similarity value $D_{A2}$ by the similarity value $D_{B1}$.

As still another example, the control unit 130 may determine the matching index to be identical to a value obtained by dividing the product of the similarity value $D_{A1}$ and the similarity value $D_{A2}$ by the similarity value $D_{B2}$.

As still another example, the control unit 130 may determine the matching index to be identical to a value obtained by dividing the similarity value $D_{A1}$ by the product of the similarity value $D_{B1}$ and the similarity value $D_{B2}$.

As still another example, the control unit 130 may determine the matching index to be identical to a value obtained by dividing the similarity value $D_{A2}$ by the product of the similarity value $D_{B1}$ and the similarity value $D_{B2}$.

As still another example, the control unit 130 may determine the matching index to be identical to a value obtained by dividing the product of the similarity value $D_{A1}$ and the similarity value $D_{A2}$ by the product of the similarity value $D_{B1}$ and the similarity value $D_{B2}$.

In this regard, even with the same abnormal pattern, the battery voltage may be affected by other parameter(s) of the battery B (e.g., current, temperature, SOC (State Of Charge) and SOH (State Of Health), etc.). The maximum-minimum normalization may partially reduce the dissimilarity between the abnormal input time series 210 and the reference time series 320 caused by different parameter(s). Therefore, in determining the matching index associated with each reference time series, when at least one of the similarity values $D_{A1}$, $D_{B1}$ is combined with at least one of the similarity values $D_{A2}$, $D_{B2}$, more accurate abnormal patterns may be identified.

The control unit 130 may determine a plurality of matching indexes one-to-one corresponding to the plurality of reference time series by comparing the plurality of reference time series with the abnormal input time series 210 one by one. Then, the control unit 130 may determine a minimum matching index among the plurality of matching indexes, obtain an abnormal pattern corresponding to the reference time series of the minimum matching index among the plurality of abnormal patterns from the database 120, and identify the abnormal pattern of the abnormal input time series 210 to be identical to the obtained abnormal pattern.

Figure 5:
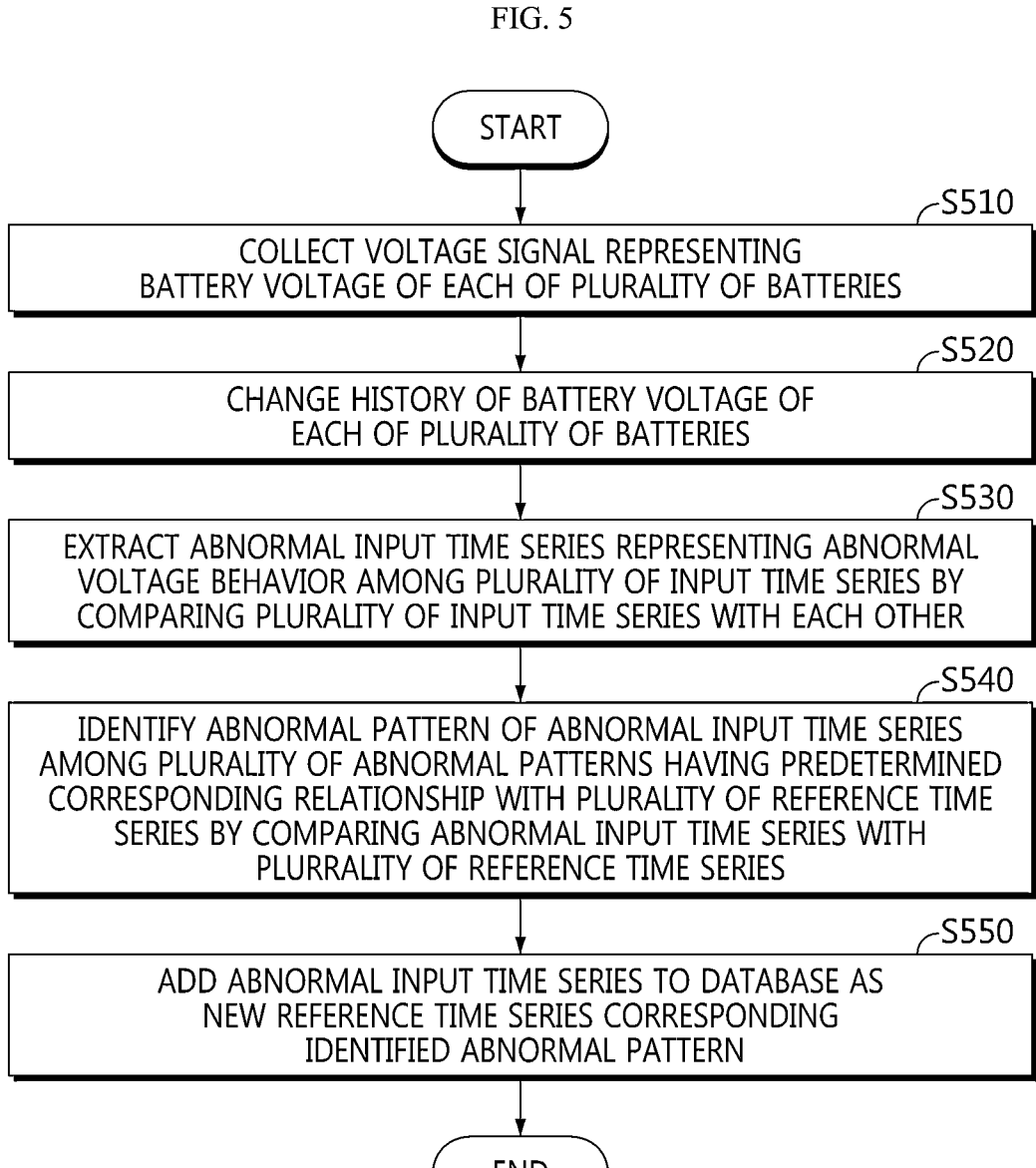
FIG. 5 is a flowchart exemplarily showing a battery diagnosing method according to the present disclosure.

FIG. 5 is a flowchart exemplarily showing a battery diagnosing method according to the present disclosure. The method of FIG. 5 may be performed by the battery diagnosing apparatus 100 shown in FIG. 1.

Referring to FIGS. 1 to 5, in Step S510, the control unit 130 collects a voltage signal representing a battery voltage that is a voltage across both ends of each of the plurality of batteries $B_1$ to $B_n$ from the voltage measuring circuit 110.

In Step S520, the control unit 130 generates a plurality of input time series representing a change history of the battery voltage of each of the plurality of batteries $B_1$ to $B_n$ over a time region in which the plurality of batteries $B_1$ to $B_n$ have the same use condition, based on the voltage signal.

In Step S530, the control unit 130 extracts an abnormal input time series 210 representing abnormal voltage behavior among the plurality of input time series by comparing the plurality of input time series with each other.

In Step S540, the control unit 130 identifies an abnormal pattern of the abnormal input time series 210 among a plurality of abnormal patterns having a predetermined corresponding relationship with the plurality of reference time series by comparing the abnormal input time series 210 with the plurality of reference time series one by one. The control unit 130 calculates at least one of the two similarity values $D_{A1}$, $D_{A2}$ and at least one of the two similarity values $D_{B1}$, $D_{B2}$ for each of the plurality of reference time series, and combines the calculated values to obtain a plurality of matching indexes one-to-one corresponding to the plurality of reference time series. Then, the control unit 130 identifies the abnormal pattern of the abnormal input time series 210 to be identical to the abnormal pattern corresponding to the reference time series associated with the minimum matching index among the plurality of matching indexes.

In step S550, the control unit 130 may add the abnormal input time series 210 to the database 120 as a new reference time series corresponding to the abnormal pattern identified in Step S540. Accordingly, the identification performance of the abnormal pattern using the plurality of reference time series may be enhanced. Additionally, the control unit 130 may transmit the abnormal pattern of the abnormal input time series 210 to the upper controller 2, or output visual and/or auditory feedback for notifying the abnormal pattern of the abnormal input time series 210 to the user through the interface unit 140.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery system
10: battery assembly
B: battery
20: switch
30: charging and discharging circuit
100: battery diagnosing apparatus
110: voltage measuring circuit
120: database
140: control unit

What is claimed is:

1. A battery diagnosing apparatus, comprising:

a voltage measuring circuit configured to generate a voltage signal representing a battery voltage that is a voltage across both ends of each of a plurality of batteries;

a database configured to store a plurality of abnormal patterns, a plurality of reference time series, and a predetermined corresponding relationship between the plurality of abnormal patterns and the plurality of reference time series; and a control unit configured to generate a plurality of input time series associated with the plurality of batteries, wherein each of the plurality of input time series represents a change history of the battery voltage of a corresponding one of the plurality of batteries, based on a corresponding voltage signal, wherein the control unit is configured to extract an abnormal input time series representing an abnormal voltage behavior among the plurality of input time series by comparing the plurality of input time series with each other, wherein the control unit is configured to identify an abnormal pattern of the abnormal input time series among the plurality of abnormal patterns by comparing the abnormal input time series with the plurality of reference time series one by one, wherein for each of the plurality of reference time series, the control unit is configured to:

calculate a first similarity value representing a signal distance between the abnormal input time series and a respective reference time series by using dynamic time warping;

convert the abnormal input time series and the respective reference time series into a first arranged time series and a second arranged time series having a same time length, respectively, by using the dynamic time warping;

calculate a second similarity value representing a Pearson correlation coefficient between the first arranged time series and the second arranged time series; and determine a matching index between the abnormal input time series and the respective reference time series to be identical to a value obtained by dividing the first similarity value by the second similarity value, and wherein the control unit is configured to identify the abnormal pattern of the abnormal input time series to be identical to an abnormal pattern corresponding to a reference time series associated with one of the plurality of matching indexes determined for the plurality of reference time series.

2. The battery diagnosing apparatus according to claim 1, wherein the control unit is configured to identify the abnormal pattern of the abnormal input time series to be identical to an abnormal pattern corresponding to a reference time series associated with a minimum matching index among the plurality of matching indexes.

3. The battery diagnosing apparatus according to claim 1, wherein the control unit is configured to add the abnormal input time series to the database as a new reference time series corresponding to the identified abnormal pattern.

4. A battery system, comprising the battery diagnosing apparatus according to claim 1.

5. A battery diagnosing apparatus, comprising:

a voltage measuring circuit configured to generate a voltage signal representing a battery voltage that is a voltage across both ends of each of a plurality of batteries;

a database configured to store a plurality of abnormal patterns, a plurality of reference time series, and a predetermined corresponding relationship between the plurality of abnormal patterns and the plurality of reference time series; and a control unit configured to generate a plurality of input time series associated with the plurality of batteries, wherein each of the plurality of input time series represents a change history of the battery voltage of a corresponding one of the plurality of batteries, based on a corresponding voltage signal, wherein the control unit is configured to extract an abnormal input time series representing an abnormal voltage behavior among the plurality of input time series by comparing the plurality of input time series with each other, wherein the control unit is configured to identify an abnormal pattern of the abnormal input time series among the plurality of abnormal patterns by comparing the abnormal input time series with the plurality of reference time series one by one, wherein for each of the plurality of reference time series, the control unit is configured to:

convert the abnormal input time series and a respective reference time series into a first normalized time series and a second normalized time series, respectively, by using maximum-minimum normalization;

calculate a first similarity value representing a signal distance between the first normalized time series and the second normalized time series by using dynamic time warping;

convert the first normalized time series and the second normalized time series into a first arranged time series and a second arranged time series having a same time length, respectively, by using the dynamic time warping;

calculate a second similarity value representing a Pearson correlation coefficient between the first arranged time series and the second arranged time series; and determine a matching index between the abnormal input time series and the respective reference time series to be identical to a value obtained by dividing the first similarity value by the second similarity value, and wherein the control unit is configured to identify the abnormal pattern of the abnormal input time series to be identical to an abnormal pattern corresponding to a reference time series associated with one of the plurality of matching indexes determined for the plurality of reference time series.

6. The battery diagnosing apparatus according to claim 5, wherein the control unit is configured to identify the abnormal pattern of the abnormal input time series to be identical to an abnormal pattern corresponding to a reference time series associated with a minimum matching index among the plurality of matching indexes.

7. A battery diagnosing apparatus, comprising:

a voltage measuring circuit configured to generate a voltage signal representing a battery voltage that is a voltage across both ends of each of a plurality of batteries;

a database configured to store a plurality of abnormal patterns, a plurality of reference time series, and a predetermined corresponding relationship between the plurality of abnormal patterns and the plurality of reference time series; and a control unit configured to generate a plurality of input time series associated with the plurality of batteries, wherein each of the plurality of input time series represents a change history of the battery voltage of a corresponding one of the plurality of batteries, based on a corresponding voltage signal, wherein the control unit is configured to extract an abnormal input time series representing an abnormal voltage behavior among the plurality of input time series by comparing the plurality of input time series with each other, wherein the control unit is configured to identify an abnormal pattern of the abnormal input time series among the plurality of abnormal patterns by comparing the abnormal input time series with the plurality of reference time series one by one, wherein for each of the plurality of reference time series, the control unit is configured to:

calculate a first similarity value representing a signal distance between the abnormal input time series and a respective reference time series by using dynamic time warping;

convert the abnormal input time series and the respective reference time series into a first arranged time series and a second arranged time series having a same time length, respectively, by using the dynamic time warping;

calculate a second similarity value representing a Pearson correlation coefficient between the first arranged time series and the second arranged time series;

convert the first arranged time series and the second arranged time series into a first normalized time series and a second normalized time series, respectively, by using maximum-minimum normalization;

calculate a third similarity value representing a signal distance between the first normalized time series and the second normalized time series by using dynamic time warping;

calculate a fourth similarity value representing a Pearson correlation coefficient between the first normalized time series and the second normalized time series; and determine a matching index between the abnormal input time series and the respective reference time series by dividing any one of the first similarity value, the third similarity value or a product of the first and third similarity values by any one of the second similarity value, the fourth similarity value or a product of the second and fourth similarity values, and wherein the control unit is configured to identify the abnormal pattern of the abnormal input time series to be identical to an abnormal pattern corresponding to a reference time series associated with one of the plurality of matching indexes determined for the plurality of reference time series.

8. The battery diagnosing apparatus according to claim 7, wherein the control unit is configured to identify the abnormal pattern of the abnormal input time series to be identical to an abnormal pattern corresponding to a reference time series associated with a minimum matching index among the plurality of matching indexes.

9. A battery diagnosing method, comprising:

collecting a voltage signal representing a battery voltage that is a voltage across both ends of each of a plurality of batteries;

generating a plurality of input time series associated with the plurality of batteries, wherein each of the plurality of input time series represents a change history of the battery voltage of a corresponding one of the plurality of batteries, based on a corresponding voltage signal;

extracting an abnormal input time series representing an abnormal voltage behavior among the plurality of input time series by comparing the plurality of input time series with each other; and identifying an abnormal pattern of the abnormal input time series among a plurality of abnormal patterns having a predetermined corresponding relationship with a plurality of reference time series by comparing the abnormal input time series with the plurality of reference time series one by one, wherein for each of the plurality of reference time series, the battery diagnosing method further comprises:

calculating a first similarity value representing a signal distance between the abnormal input time series and a respective reference time series by using dynamic time warping;

converting the abnormal input time series and the respective reference time series into a first arranged time series and a second arranged time series having a same time length, respectively, by using the dynamic time warping;

calculating a second similarity value representing a Pearson correlation coefficient between the first arranged time series and the second arranged time series; and determining a matching index between the abnormal input time series and the respective reference time series to be identical to a value obtained by dividing the first similarity value by the second similarity value, and wherein the battery diagnosing method further comprises identifying the abnormal pattern of the abnormal input time series to be identical to an abnormal pattern corresponding to a reference time series associated with one of the plurality of matching indexes determined for the plurality of reference time series.

10. A battery diagnosing apparatus, comprising:

a voltage measuring circuit configured to generate a voltage signal representing a battery voltage that is a voltage across both ends of each of a plurality of batteries;

a database configured to store a plurality of abnormal patterns, a plurality of reference time series, and a predetermined corresponding relationship between the plurality of abnormal patterns and the plurality of reference time series; and a control unit configured to generate a plurality of input time series associated with the plurality of batteries, wherein each of the plurality of input time series represents a change history of the battery voltage of a corresponding one of the plurality of batteries, based on a corresponding voltage signal, wherein the control unit is configured to extract an abnormal input time series representing an abnormal voltage behavior among the plurality of input time series by comparing the plurality of input time series with each other, wherein the control unit is configured to identify an abnormal pattern of the abnormal input time series among the plurality of abnormal patterns by comparing the abnormal input time series with the plurality of reference time series one by one, wherein for each of the plurality of reference time series, the control unit is configured to:

calculate a first similarity value representing a signal distance between the abnormal input time series and a respective reference time series by using dynamic time warping; and determine a matching index between the abnormal input time series and the respective reference time series to be identical to a value obtained based on at least the first similarity value, and wherein the control unit is configured to identify the abnormal pattern of the abnormal input time series to be identical to an abnormal pattern corresponding to a reference time series associated with one of the plurality of matching indexes determined for the plurality of reference time series.

11. A battery diagnosing method, comprising:

collecting a voltage signal representing a battery voltage that is a voltage across both ends of each of a plurality of batteries;

generating a plurality of input time series associated with the plurality of batteries, wherein each of the plurality of input time series represents a change history of the battery voltage of a corresponding one of the plurality of batteries, based on a corresponding voltage signal;

extracting an abnormal input time series representing an abnormal voltage behavior among the plurality of input time series by comparing the plurality of input time series with each other; and identifying an abnormal pattern of the abnormal input time series among a plurality of abnormal patterns having a predetermined corresponding relationship with a plurality of reference time series by comparing the abnormal input time series with the plurality of reference time series one by one, wherein for each of the plurality of reference time series, the battery diagnosing method further comprises:

converting the abnormal input time series and a respective reference time series into a first normalized time series and a second normalized time series, respectively, by using maximum-minimum normalization;

calculating a first similarity value representing a signal distance between the first normalized time series and the second normalized time series by using dynamic time warping;

converting the first normalized time series and the second normalized time series into a first arranged time series and a second arranged time series having a same time length, respectively, by using the dynamic time warping;

calculating a second similarity value representing a Pearson correlation coefficient between the first arranged time series and the second arranged time series; and determining a matching index between the abnormal input time series and the respective reference time series to be identical to a value obtained by dividing the first similarity value by the second similarity value, and wherein the battery diagnosing method further comprises identifying the abnormal pattern of the abnormal input time series to be identical to an abnormal pattern corresponding to a reference time series associated with one of the plurality of matching indexes determined for the plurality of reference time series.

12. A battery diagnosing method, comprising:

collecting a voltage signal representing a battery voltage that is a voltage across both ends of each of a plurality of batteries;

generating a plurality of input time series associated with the plurality of batteries, wherein each of the plurality of input time series represents a change history of the battery voltage of a corresponding one of the plurality of batteries, based on a corresponding voltage signal;

extracting an abnormal input time series representing an abnormal voltage behavior among the plurality of input time series by comparing the plurality of input time series with each other; and identifying an abnormal pattern of the abnormal input time series among a plurality of abnormal patterns having a predetermined corresponding relationship with a plurality of reference time series by comparing the abnormal input time series with the plurality of reference time series one by one, wherein for each of the plurality of reference time series, the battery diagnosing method further comprises:

calculating a first similarity value representing a signal distance between the abnormal input time series and a respective reference time series by using dynamic time warping;

converting the abnormal input time series and the respective reference time series into a first arranged time series and a second arranged time series having a same time length, respectively, by using the dynamic time warping;

calculating a second similarity value representing a Pearson correlation coefficient between the first arranged time series and the second arranged time series;

converting the first arranged time series and the second arranged time series into a first normalized time series and a second normalized time series, respectively, by using maximum-minimum normalization;

calculating a third similarity value representing a signal distance between the first normalized time series and the second normalized time series by using dynamic time warping;

calculating a fourth similarity value representing a Pearson correlation coefficient between the first normalized time series and the second normalized time series; and determining a matching index between the abnormal input time series and the respective reference time series by dividing any one of the first similarity value, the third similarity value or a product of the first and third similarity values by any one of the second similarity value, the fourth similarity value or a product of the second and fourth similarity values, and wherein the battery diagnosing method further comprises identifying the abnormal pattern of the abnormal input time series to be identical to an abnormal pattern corresponding to a reference time series associated with one of the plurality of matching indexes determined for the plurality of reference time series.

13. A battery diagnosing method, comprising:

collecting a voltage signal representing a battery voltage that is a voltage across both ends of each of a plurality of batteries;

generating a plurality of input time series associated with the plurality of batteries, wherein each of the plurality of input time series represents a change history of the battery voltage of a corresponding one of the plurality of batteries, based on a corresponding voltage signal;

extracting an abnormal input time series representing an abnormal voltage behavior among the plurality of input time series by comparing the plurality of input time series with each other; and identifying an abnormal pattern of the abnormal input time series among a plurality of abnormal patterns having a predetermined corresponding relationship with a plurality of reference time series by comparing the abnormal input time series with the plurality of reference time series one by one, wherein for each of the plurality of reference time series, the battery diagnosing method further comprises:

calculating a first similarity value representing a signal distance between the abnormal input time series and a respective reference time series by using dynamic time warping; and determining a matching index between the abnormal input time series and the respective reference time series to be identical to a value obtained based on at least the first similarity value, and wherein the battery diagnosing method further comprises identifying the abnormal pattern of the abnormal input time series to be identical to an abnormal pattern corresponding to a reference time series associated with one of the plurality of matching indexes determined for the plurality of reference time series.

* * * * *